(12) United States Patent
Lu et al.

(10) Patent No.: US 10,332,918 B2
(45) Date of Patent: Jun. 25, 2019

(54) PIXEL STRUCTURE

(71) Applicant: AU Optronics Corporation, Hsin-chu (TW)

(72) Inventors: Ssu-Hui Lu, Hsin-chu (TW); Chih-Chung Su, Hsin-chu (TW); Ming-Hsien Lee, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 158 days.

(21) Appl. No.: 15/457,197

(22) Filed: Mar. 13, 2017

(65) Prior Publication Data
US 2017/0263653 A1    Sep. 14, 2017

(30) Foreign Application Priority Data

Mar. 14, 2016    (TW) .............................. 105107744 A

(51) Int. Cl.
| | |
|---|---|
| *H01L 27/12* | (2006.01) |
| *H01L 27/15* | (2006.01) |
| *G02F 1/1362* | (2006.01) |
| *G02F 1/1343* | (2006.01) |

(52) U.S. Cl.
CPC .... *H01L 27/1248* (2013.01); *G02F 1/136227* (2013.01); *H01L 27/124* (2013.01); *H01L 27/1225* (2013.01); *H01L 27/1244* (2013.01); *H01L 27/156* (2013.01); *G02F 2001/134372* (2013.01)

(58) Field of Classification Search
CPC combination set(s) only.
See application file for complete search history.

(56) References Cited

U.S. PATENT DOCUMENTS

| | | | |
|---|---|---|---|
| 2016/0300855 A1 | 10/2016 | Cheng et al. | |
| 2016/0370622 A1* | 12/2016 | Kim | ................ G02F 1/134363 |
| 2017/0317105 A1* | 11/2017 | Kim | ................ G02F 1/133345 |
| 2018/0088366 A1* | 3/2018 | Xu | ........................ G02F 1/1323 |

FOREIGN PATENT DOCUMENTS

| | | |
|---|---|---|
| TW | 201037435 A1 | 10/2010 |
| TW | 201445230 A | 12/2014 |

OTHER PUBLICATIONS

Office Action issued by (TIPO) Intellectual Property Office, Ministry of Economic Affairs, R. O. C. dated Dec. 6, 2016 for Application No. 105107744, Taiwan.

\* cited by examiner

*Primary Examiner* — Mamadou L Diallo
(74) *Attorney, Agent, or Firm* — Tim Tingkang Xia; Locke Lord LLP

(57) ABSTRACT

A pixel structure including a first pixel unit, a second pixel unit, a first insulating layer, and a common electrode is provided. The first and second pixel units are disposed on a substrate, and includes a first drain and a first pixel electrode, and a second drain and a second pixel electrode, respectively. The first insulating layer covers the first and second drains. The first and second pixel electrodes are disposed on the first insulating layer, and the first insulating layer has first and second contact holes uncovering the first and second drains, respectively. The common electrode is disposed on the first insulating layer, and is electrically insulated from the first and second pixel electrodes, and has a common opening. When projected onto the substrate, the first and second contact holes are disposed within a region of the common opening.

15 Claims, 13 Drawing Sheets

PIXEL STRUCTURE

CROSS-REFERENCE TO RELATED PATENT APPLICATION

This application claims the benefit of priority to Taiwan Patent Application No. 105107744, filed Mar. 14, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to a pixel structure, and in particular, to a pixel structure in which adjacent pixel units share a common opening of the same common electrode.

BACKGROUND

A Head-mount Display (HMD) is a display worn on a human body. The head-mount display is a small-sized display in which a lens assembly is disposed at a position very close to the eyes so that a user can view through this display, therefore achieving an effect similar to that of watching a large-sized display located some distance away. Generally speaking, manners of viewing via a display include a double-eye manner and a single-eye manner, and the size of the display varies in accordance with different watching manners. To develop a head-mount display that meets the requirements of being thin, light, and close to the eyes, a pixel size needs to be further reduced to improve the resolution of the display, so as to achieve the purpose of reducing the size of the display. However, because of the limitation of the manufacturing process, a conductive structure in pixels may be short-circuited as gaps become smaller, making it difficult to implement a high-resolution pixel design.

SUMMARY

The present disclosure provides a pixel structure, which prevents short-circuiting of a conductive structure in a pixel unit.

The pixel structure of the present disclosure includes a first pixel unit, a second pixel unit, a first insulating layer, and a common electrode. The first pixel unit is disposed on a substrate, and comprises a first drain and a first pixel electrode. The second pixel unit is disposed on the substrate, and comprises a second drain and a second pixel electrode. The first insulating layer covers the first drain and the second drain. The first pixel electrode and the second pixel electrode are disposed on the first insulating layer, and the first insulating layer has a first contact hole uncovering a part of the first drain and a second contact hole uncovering a part of the second drain. The common electrode is disposed on the first insulating layer and electrically insulated from the first pixel electrode and the second pixel electrode, the common electrode has a common opening, and in a vertical projection direction onto the substrate, both the first contact hole and the second contact hole are located in a region of the common opening.

In an embodiment of the present disclosure, in the vertical projection onto the substrate, an edge of the first contact hole is located within an edge of the first drain.

In an embodiment of the present disclosure, the pixel structure further comprises a second insulating layer and a first signal line, the first drain and the second drain are disposed on the second insulating layer and are filled into a third contact hole and a fourth contact hole of the second insulating layer, and the first signal line is located between the first pixel unit and the second pixel unit.

In an embodiment of the present disclosure, in a horizontal direction, a symmetry center of the first contact hole has a shift distance relative to a symmetry center of the first drain, and an edge of the first contact hole is located within an edge of the first drain.

In an embodiment of the present disclosure, the pixel structure further comprises a first signal line, the first signal line is located between the first pixel unit and the second pixel unit, a symmetry center of the first contact hole is closer to the first signal line than the symmetry center of the first drain is, and a symmetry center of the second contact hole is closer to the first signal line than a symmetry center of the second drain is.

In an embodiment of the present disclosure, the pixel structure further comprises a second insulating layer, the first drain and the second drain are disposed on the second insulating layer, the first contact hole and the second contact hole uncovers a partial top portion of the second insulating layer, respectively.

In an embodiment of the present disclosure, the pixel structure further comprises a first signal line, the first signal line is located between the first pixel unit and the second pixel unit, a symmetry center of the first contact hole is closer to the first signal line than a symmetry center of the first drain is, and a symmetry center of the second contact hole is closer to the first signal line than a symmetry center of the second drain is.

In an embodiment of the present disclosure, the pixel structure further comprises a third insulating layer, disposed on the first insulating layer, covering a part of the common electrode, and having a fifth contact hole and a sixth contact hole, the fifth contact hole is in communication with the first contact hole, and the sixth contact hole is in communication with the second contact hole.

In an embodiment of the present disclosure, the first pixel electrode is disposed on the third insulating layer and is electrically connected to the first drain through the fifth contact hole and the first contact hole, and the second pixel electrode is disposed on the third insulating layer and is electrically connected to the second drain through the sixth contact hole and the second contact hole.

In an embodiment of the present disclosure, the first pixel unit further comprises a first source and a first channel layer, and the first source is electrically connected to the first channel layer through a seventh contact hole.

In an embodiment of the present disclosure, the pixel structure further comprises a third pixel unit having a third drain and a third pixel electrode, and the third pixel unit is disposed between the first pixel unit and the second pixel unit.

In an embodiment of the present disclosure, the first insulating layer further covers the third drain, the third pixel electrode is disposed on the first insulating layer, the first insulating layer further has an eighth contact hole uncovering the third drain, and in the vertical projection onto the substrate, the first contact hole, the second contact hole, and the eighth contact hole all are located in the region of the common opening.

In an embodiment of the present disclosure, in the vertical projection onto the substrate, the first contact hole and the first drain at least partially overlap, the second contact hole and the second drain at least partially overlap, and an edge of the eighth contact hole is located within an edge of the third drain.

In an embodiment of the present disclosure, the pixel structure further comprises a first signal line and a second signal line, the first signal line is located between the first pixel unit and the third pixel unit, the second signal line is located between the second pixel unit and the third pixel unit, in the vertical projection onto the substrate, distances from the eighth contact hole to the first signal line and to the second signal line are substantially the same, a symmetry center of the first contact hole is closer to the first signal line than a symmetry center of the first drain is, and a symmetry center of the second contact hole is closer to the second signal line than a symmetry center of the second drain is.

In an embodiment of the present disclosure, the pixel structure further comprises a third insulating layer, disposed on the first insulating layer, covering the common electrode, and having a fifth contact hole, a sixth contact hole, and a ninth contact hole, the fifth contact hole is in communication with the first contact hole, the sixth contact hole is in communication with the second contact hole, and the ninth contact hole is in communication with the eighth contact hole.

In an embodiment of the present disclosure, the first pixel electrode is disposed on the third insulating layer and is electrically connected to the first drain through the fifth contact hole and the first contact hole, the second pixel electrode is disposed on the third insulating layer and is electrically connected to the second drain through the sixth contact hole and the second contact hole, and the third pixel electrode is disposed on the third insulating layer and is electrically connected to the third drain through the ninth contact hole and the eighth contact hole.

Based on the description above, in the present disclosure, the insulating layer has respective contact holes that uncover drains of pixel units, and the common opening of the common electrode uncovers contact holes of two adjacent pixel units at the same time. In this way, a sufficient gap is maintained between the common opening and the contact hole, so as to avoid short-circuiting the common electrode and the drain. The pixel structure will therefore be equipped with good device properties.

To make the above characteristics and advantages of the present disclosure clearer and easier to understand, the following embodiments are described in detail in conjunction with accompanying figures.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1A:
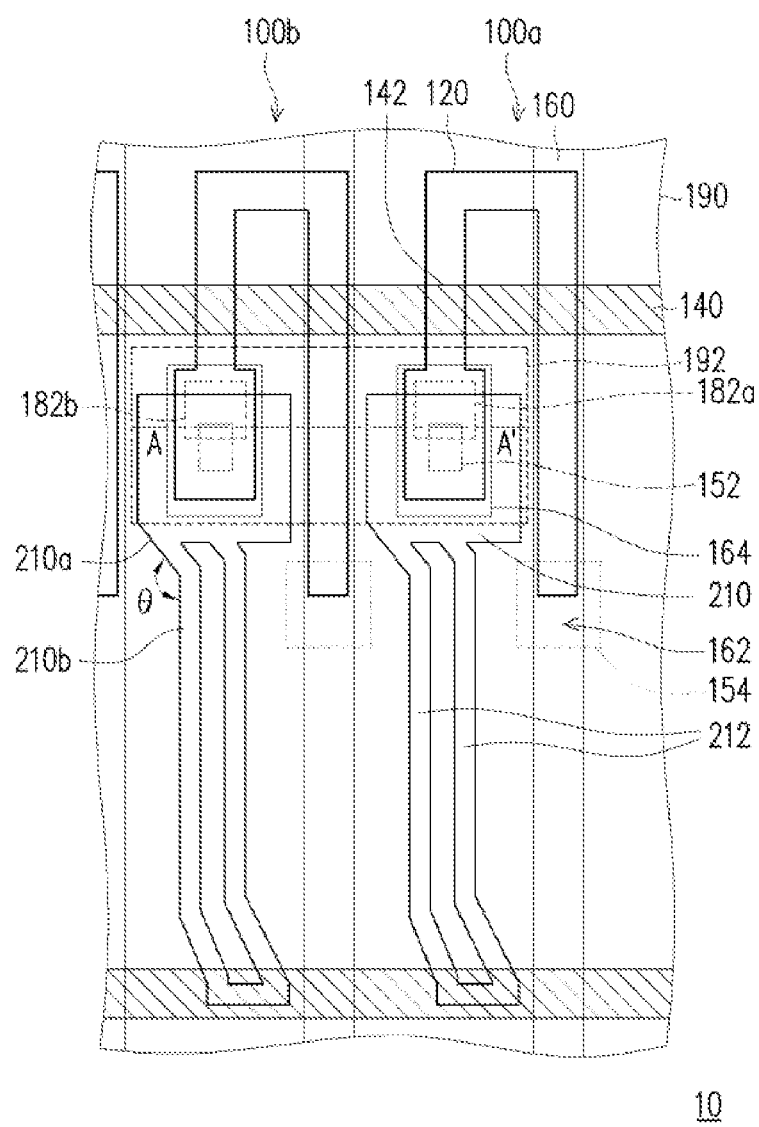
FIG. 1A is a schematic diagram of a pixel structure according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. Further, the term "connect" or "electrically connected," as used herein, refers to the direct or indirect physical or electrical contact between or among two or more components, or the mutual operation or action of two or more components.

Figure 1B:
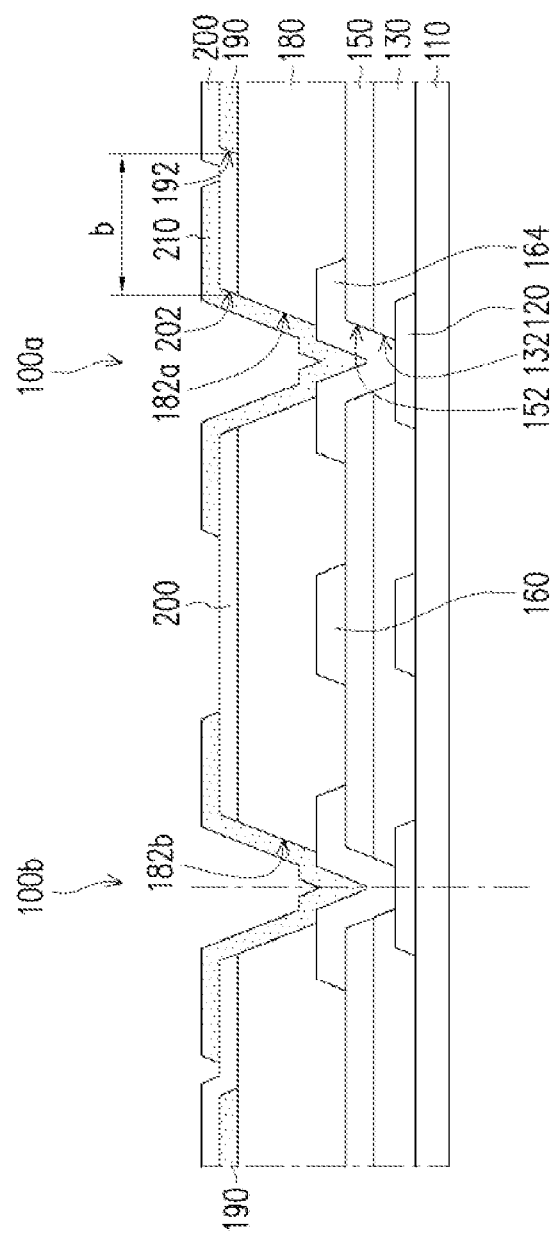
FIG. 1B is a cross-sectional schematic diagram along line A-A' shown in FIG. 1A.

FIG. 1A is a schematic diagram of a pixel structure according to an embodiment of the present disclosure, and FIG. 1B is a cross-sectional schematic diagram along line A-A' shown in FIG. 1A. Please refer to FIG. 1A and FIG. 1B at the same time. In the present embodiment, a pixel structure 10 comprises a substrate 110, two adjacent pixel units 100a and 100b, a first insulating layer 180, and a common electrode 190. In the present embodiment, the pixel structure 10 further comprises scan lines 140, data lines 160, a gate insulating layer 130, a second insulating layer 150, and a third insulating layer 200. A data line 160 is located, for example, between the two adjacent pixel units 100a and 100b. In the present embodiment, a straight line is used as an example for the data line 160, but the present disclosure is not limited thereto. In other embodiments, the data line 160 may also be a meander line or a line in a different shape.

In the present embodiment, the pixel units 100a and 100b are located, for example, on the substrate 110. The pixel units 100a and 100b each includes, for example, a gate 142, a channel layer 120, a source 162, a drain 164, and a pixel electrode 210, and the source 162 and the drain 164 are electrically connected to the channel layer 120 and form a thin-film transistor together with the gate 142. In the present embodiment, the source 162 and the drain 164 are located, for example, at two ends of the channel layer 120, and partially overlap with the channel layer 120; the drain 164 is located, for example, between the channel layer 120 and the pixel electrode 210 in a vertical direction relative to the substrate 110, and partially overlaps with the channel layer 120 and the pixel electrode 210. In the present embodiment, the drain 164 is, for example, a rectangular shape in top view, but the present disclosure is not limited thereto. In other embodiments, the drain 164 may also be circular, polygonal, or have an irregular shape. In the present embodiment, the source 162 and the drain 164 are electrically connected to the channel layer 120 through a contact hole 154 and a contact hole 152 of the second insulating layer 150 respectively, and the gate insulating layer 130 is also provided with contact holes at positions corresponding to the contact holes 152 and 154, such that the channel layer 120 is electrically connected to the source 162 and the drain 164 respectively. For example, a contact hole 132 corresponds to the position of the contact hole 152, such that the channel layer 120 is electrically connected to the drain 164. In the present embodiment, a material of the channel layer 120 is, for example, a metal-oxide semiconductor material or an amorphous silicon material, such as Indium-Gallium-Zinc Oxide (IGZO), zinc oxide (ZnO), tin oxide (SnO), Indium-Zinc Oxide (IZO), Gallium-Zinc Oxide (GZO), Zinc-Tin Oxide (ZTO) or Indium-Tin Oxide (ITO), or another suitable material, or a combination thereof. In the present embodiment, the gate 142 is, for example, a part of the scan line 140. The source 162 is electrically connected to the data line 160, or the source 162 is a part of the data line 160. It should be additionally noted that, in the present embodiment, a thin-film transistor 200 of a top gate type in which the channel layer 120 is located between the substrate 110 and the gate 142 is used as an example; however, a thin film transistor of a bottom gate type or another type may also be applied to the present disclosure. In the present embodiment, the pixel units 100a and 100b are, for example, two of a red pixel unit, a blue pixel unit, and a green pixel unit.

In the present embodiment, the first insulating layer 180 is formed, for example, completely above the substrate 110 and covers the thin-film transistors, the scan lines 140, the data lines 160, and the second insulating layer 150. The first insulating layer 180 covers the drains 164, and has contact holes 182a and 182b that uncover the drains 164. As is described above, the drain 164, for example, partially overlaps with the pixel electrode 210 in the vertical direction relative to the substrate 110; the first insulating layer 180 is disposed between the drain 164 and the pixel electrode 210, and the contact holes 182a and 182b of the first insulating layer 180 uncover the drains 164. In the present embodiment, in a horizontal direction, the symmetry centers of the contact holes 182a and 182b, for example, substantially overlap with the symmetry centers of the drains 164, as shown in FIG. 1B; and in a vertical projection direction onto the substrate 110, edges of the contact holes 182a and 182b are located, for example, within edges of the drains 164. The horizontal direction described herein may, for example, be an extension direction of the scan line 140; the symmetry center refers to a symmetry center of an object in the horizontal direction; and an extension direction of a symmetry axis is, for example, parallel to an extension direction of the data line. A material of the first insulating layer 180 is, for example, an organic material (such as a polyester (PET), a polyene, a polyacrylamide, a polycarbonate, a polyepoxide, a polystyrene, a polyether, a polyketone, a polyalcohol, a polyaldehyde, or another suitable material, or a combination thereof), an inorganic material (such as silicon oxide, silicon nitride, silicon oxynitride, another suitable material, or a stacked layer of at least two of the above materials), or another suitable material, or a combination thereof.

In the present embodiment, the common electrode 190 is located, for example, on the first insulating layer 180, and has a common opening 192; the common opening 192 exposes or uncovers the drains 164 of the two adjacent pixel units 100a and 100b at the same time. In the present embodiment, the third insulating layer 200 is also formed, for example, completely above the common electrode 190, and has contact holes 202 exposing or uncovering the drains 164. In the present embodiment, the contact holes 202 are formed, for example, together with the contact holes 182a and 182b, but the present disclosure is not limited thereto. A material of the third insulating layer 200 is, for example, different from that of the first insulating layer 180. The material of the third insulating layer 200 is, for example, an inorganic material (such as silicon oxide, silicon nitride, silicon oxynitride, another suitable material, or a stacked layer of at least two of the above materials), an organic material, or another suitable material, or a combination thereof. In the present embodiment, the pixel electrodes 210 are located, for example, on the third insulating layer 200, and are electrically connected to the drains 164 through the contacts holes 202 and the contact holes 182a and 182b, respectively. The common electrode 190 is electrically insulated from the pixel electrodes 210. Examples of materials of the common electrode 190 and the pixel electrode 210 include transparent conductive materials such as indium-tin oxide, but are not limited thereto; metal-containing materials may also be used according to design requirements. In the present embodiment, the pixel electrode 210 has a plurality of electrode strips 212 which are electrically connected, so as to produce higher-density electric field variations with the common electrode 190, but the present disclosure is not limited thereto. In the present embodiment, the pixel electrode 210 has, for example, a boot shape in top view, where an angle θ less than 180 degrees is formed between one side 210a and another side 210b of the boot shape. In the present embodiment, a corner of the boot shape with the angle θ is located, for example, near the common opening 192. In the present embodiment, a distance between the position of the corner and the common opening 192 is, for example, less than 5 μm. In the present embodiment, a distance between the position of the corner and the common opening 192 is, for example, less than 2 μm. In the present embodiment, a distance between the position of the corner and the common opening 192 is, for example, less than 1 μm. In an embodiment, an insulating layer located between the first insulating layer 180 and the third insulating layer 200 may further be included; the insulating layer may have a contact hole formed together with the contact holes 202, and a material of the insulating layer is, for example, an inorganic material (such as silicon oxide, silicon nitride, silicon oxynitride, another suitable material, or a stacked layer of at least two of the above materials), an organic material, or another suitable material, or a combination thereof.

In the present embodiment, all of the contact holes 152, the contact holes 182a and 182b, and the contact holes 202 corresponding to the two adjacent pixel units 100a and 100b are, for example, completely located within the region of the common opening 192. The two adjacent pixel units 100a and 100b are made to use the same common opening 192, so that a sufficient distance b is provided between an edge of the common electrode 190 and edges of the contact holes 182a and 182b; the distance b is, for example, greater than a manufacturing process limitation, 2 μm. The sufficient distance can prevent the common electrode 190 from sliding into the contact holes 182a and 182b, thus avoiding short-circuiting the drain 164 and the common electrode 190. Therefore, in the present embodiment, when being electrically connected to the drain 164, the pixel electrode 210 is not in contact with the common electrode 190; that is, the pixel electrode 210 and the common electrode 190 are spaced from each other and are not in contact. As a result, the pixel electrode 210 and the common electrode 190 may have different voltages such that an electric field is generated between the pixel electrode 210 and the common electrode 190. In the present embodiment, distances b from the edges of the common electrode 190 to the edges of the contact holes 182a and 182b meets the design specifications of being greater than 2 μm, with no needs to reduce sizes of the contact holes 182a and 182b or the thickness of the insulating layer 180. In addition, the pixel structure of the present embodiment may be used as a pixel structure of a Fringe Field Switching (FFS) liquid crystal display, and is applicable to a pixel structure required for high resolution while maintaining good electrical connection.

Figure 2A:
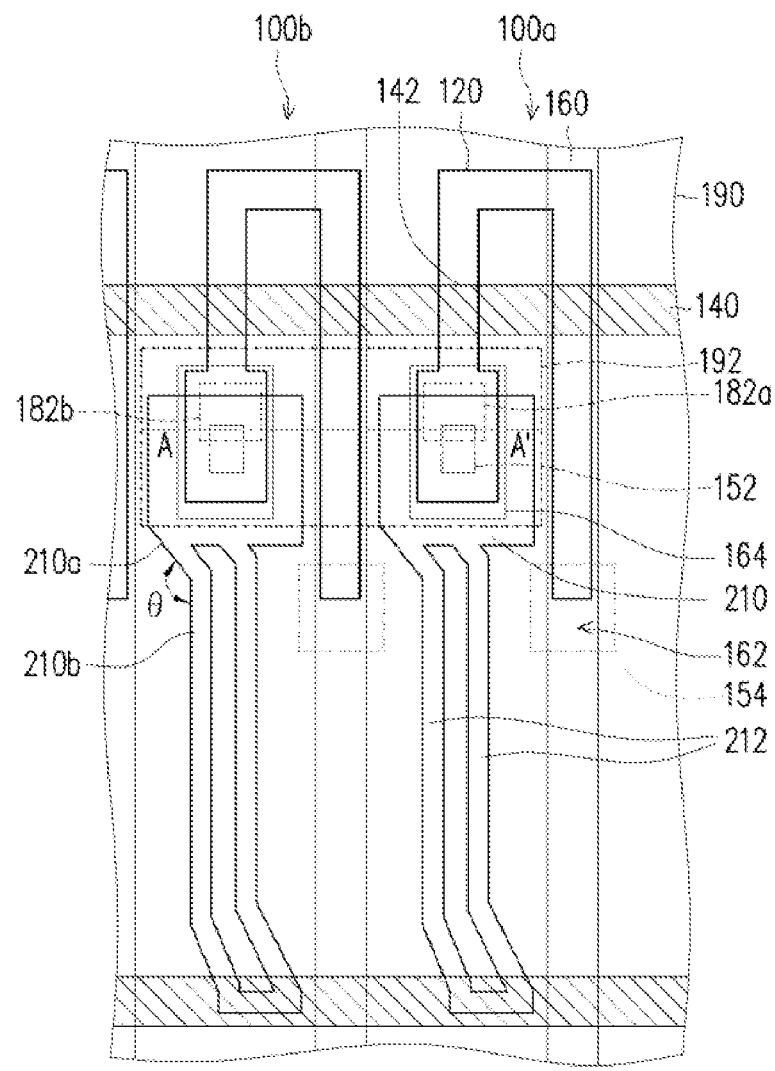
FIG. 2A is a schematic diagram of a pixel structure according to an embodiment of the present disclosure.
Figure 2B:
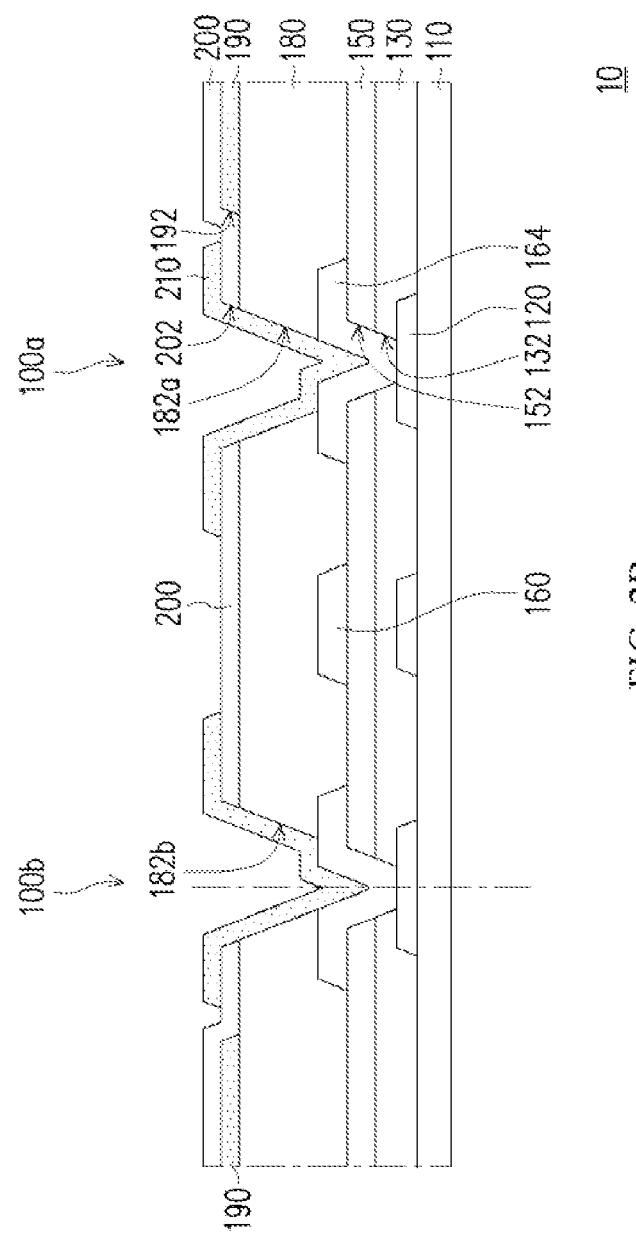
FIG. 2B is a cross-sectional schematic diagram along line A-A' shown in FIG. 2A.
Figure 3A:
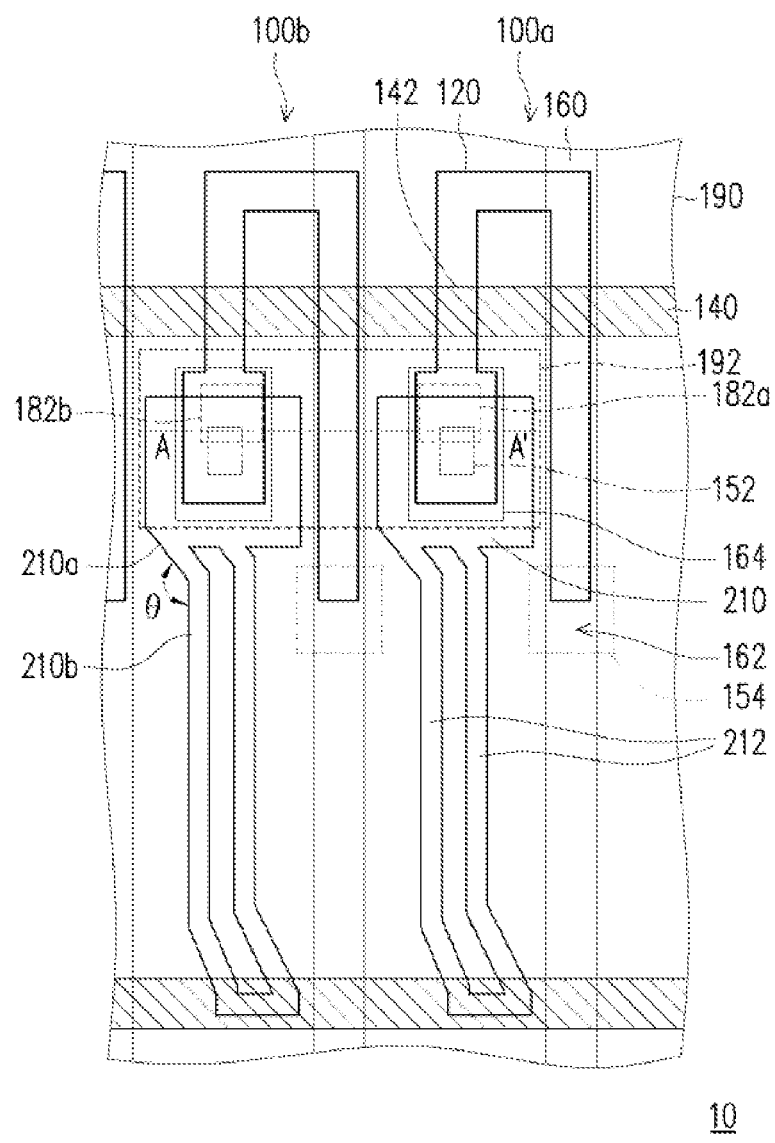
FIG. 3A is a schematic diagram of a pixel structure according to an embodiment of the present disclosure.
Figure 3B:
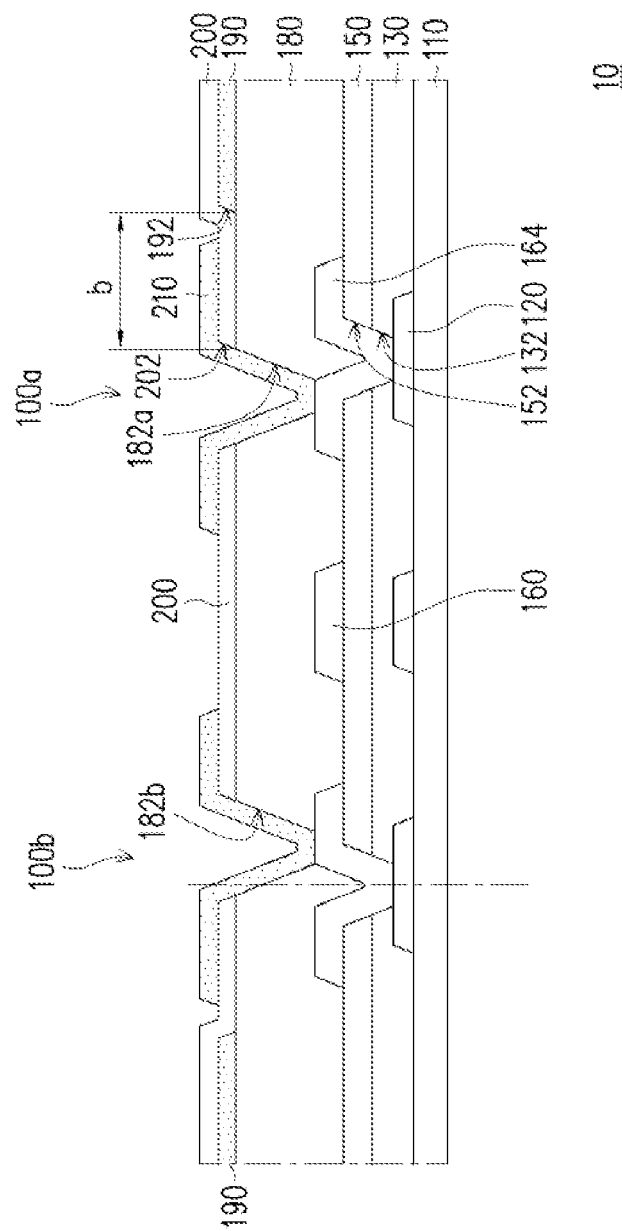
FIG. 3B is a cross-sectional schematic diagram along line A-A' shown in FIG. 3A.

FIG. 2A is a schematic diagram of a pixel structure according to an embodiment of the present disclosure, and FIG. 2B is a cross-sectional schematic diagram along line A-A' shown in FIG. 2A. Please refer to FIG. 2A and FIG. 2B at the same time. In the present embodiment, the first and second pixel units 100a and 100b differ from the foregoing embodiment in that, in the horizontal direction, the symmetry centers of the contact holes 182a and 182b, for example, deviate from the symmetry centers of the drains 164 or each has a shift distance relative to the symmetry centers of the first drains 164, as is shown in FIG. 2B. In other words, the two contact holes 182a and 182b are, for example, relative to the drains 164, deviated toward and close to the data line 160 between the two pixel units 100a and 100b, respectively, that is, the symmetry center of the contact hole 182a is closer to the data line 160 between the two pixel units 100a and 100b than the symmetry center of the drain 164 corresponding to the contact hole 182a is, and the symmetry center of the contact hole 182b is closer to the data line 160 than the symmetry center of the drain 164 corresponding to the contact hole 182b is; but in the vertical projection onto the substrate 110, the edges of the contact holes 182a and 182b are still located within the edges of the drains 164. In another embodiment, as shown in FIG. 3A and FIG. 3B, the contact holes 182a and 182b are, for example, relative to the drains 164, even closer to the data line 160. Therefore, the contact holes 182a and 182b are disposed, for example, in a manner of being misaligned with the contact holes 152. However, in the vertical projection onto the substrate 110, the edges of the contact holes 182a and 182b are still located within the edges of the drains 164.

Figure 4A:
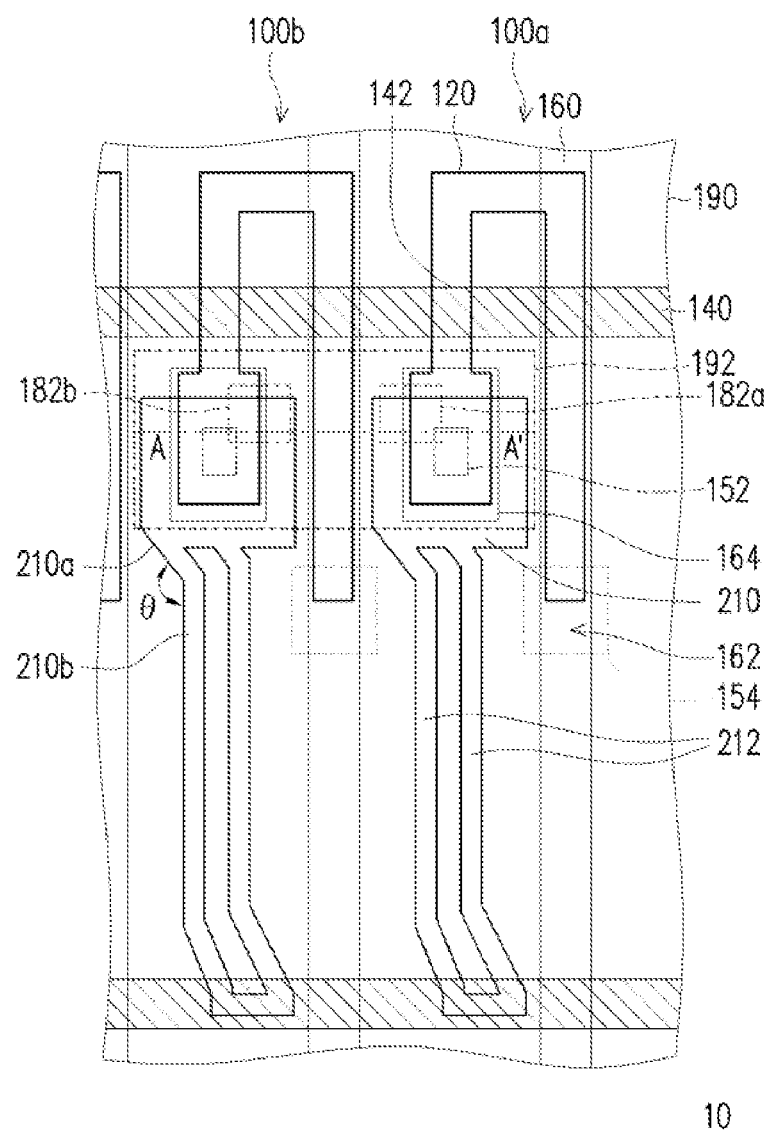
FIG. 4A is a schematic diagram of a pixel structure according to an embodiment of the present disclosure.
Figure 4B:
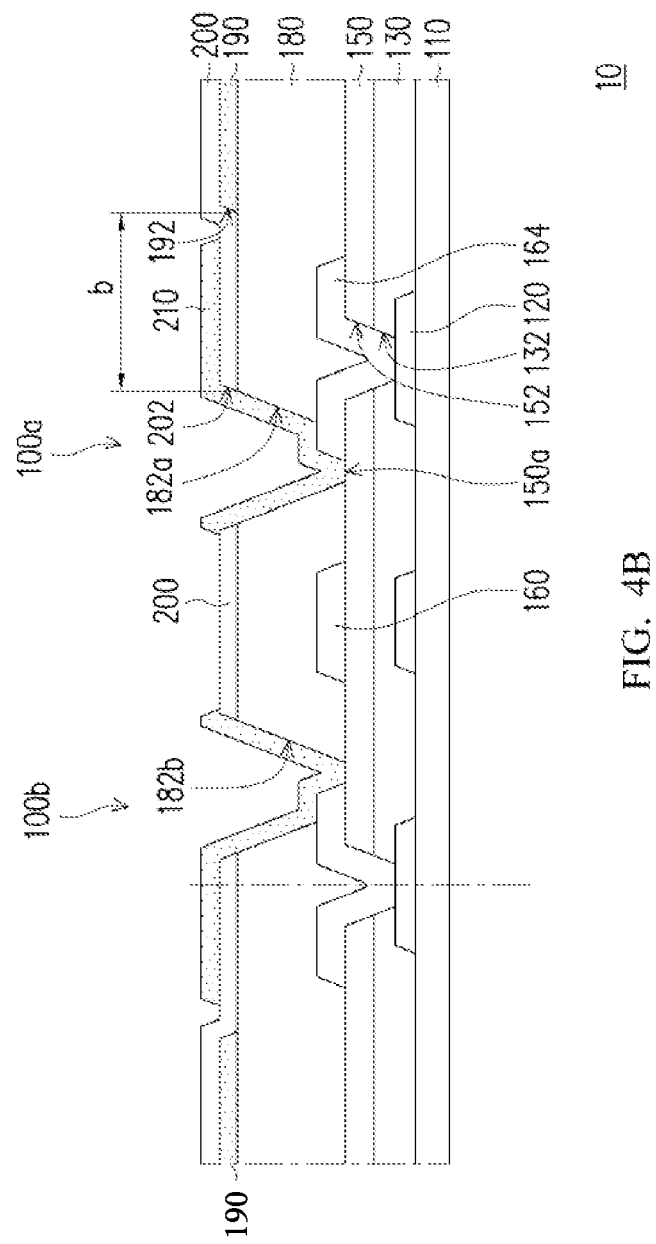
FIG. 4B is a cross-sectional schematic diagram along line A-A' shown in FIG. 4A.

FIG. 4A is a schematic diagram of a pixel structure according to an embodiment of the present disclosure, and FIG. 4B is a cross-sectional schematic diagram along line A-A' shown in FIG. 4A. Please refer to FIG. 4A and FIG. 4B at the same time. The present embodiment differ from the foregoing embodiment in that the contact holes 182a and 182b uncover or expose only a part of the drains 164, such as uncovering an edge of the drains 164; and the contact holes 182a and 182b uncover regions other than the drains 164. In other words, in the present embodiment, the two contact holes 182a and 182b are, for example, relative to the drains 164, close to the data line 160 between the two pixel units 100a and 100b, that is, the symmetry center of the contact hole 182a is closer to the data line 160 between the two pixel units 100a and 100b than the symmetry center of the drain 164 corresponding to the contact hole 182a is, and the symmetry center of the contact hole 182b is closer to the data line 160 than the symmetry center of the drain 164 corresponding to the contact hole 182b is, such that the contact holes 182a and 182b are disposed, for example, in a manner of being misaligned with the contact holes 152; and in the vertical projection onto the substrate 110, at least one edge of each of the contact holes 182a and 182b falls outside the drains 164; that is, the contact holes 182a and 182b uncover or expose a partial top portion 150a of the insulating layer 150.

In the foregoing embodiments of FIG. 2A to FIG. 4B, the adjacent pixel units 100a and 100b are made to share one common opening 192 such that the contact holes 182a and 182b of the first insulating layer 180 can shift towards the data line 160 between the adjacent pixel units 100a and 100b. In this way, it is ensured that a relatively large horizontal gap, for example, a gap greater than 2 μm, is maintained between the common electrode 190 and the edges of the contact holes 182a and 182b.

Figure 5A:
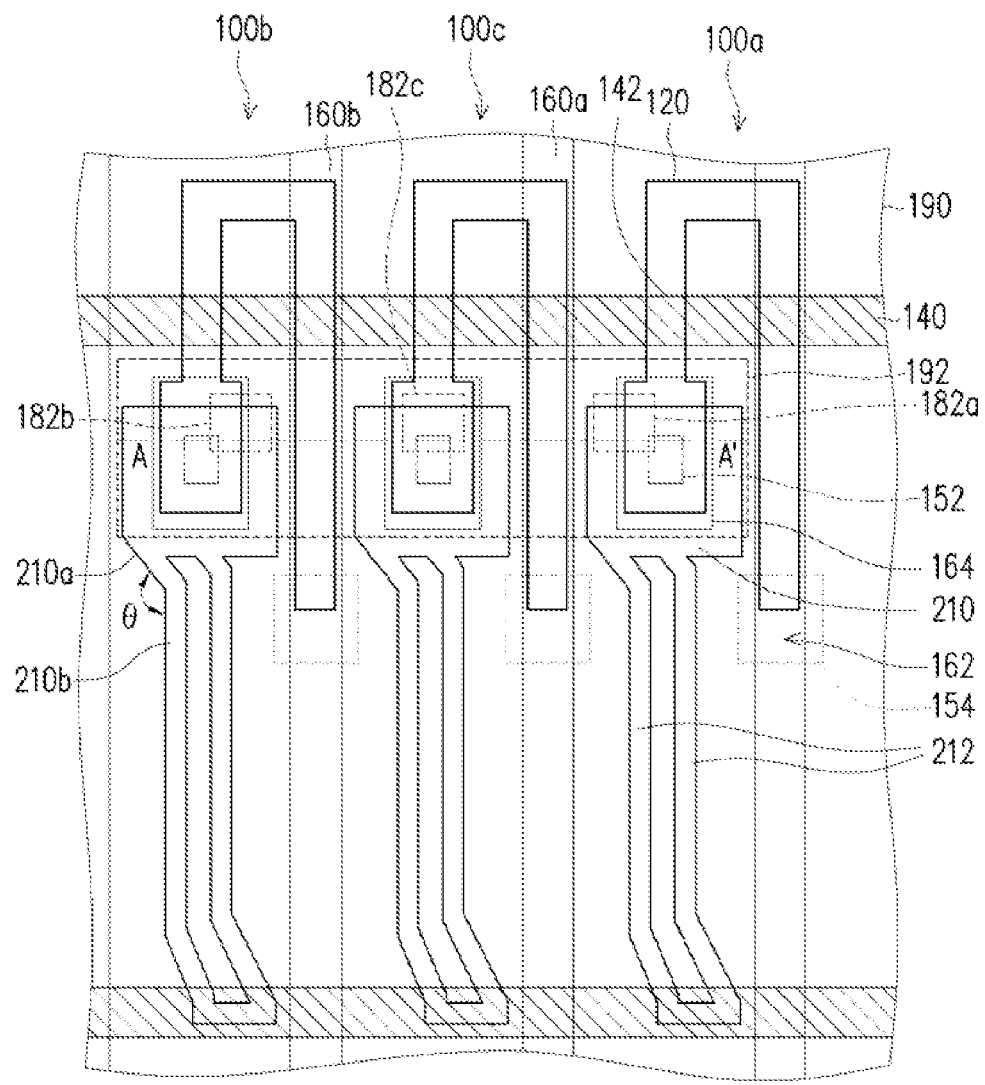
FIG. 5A is a schematic diagram of a pixel structure according to an embodiment of the present disclosure.
Figure 5B:
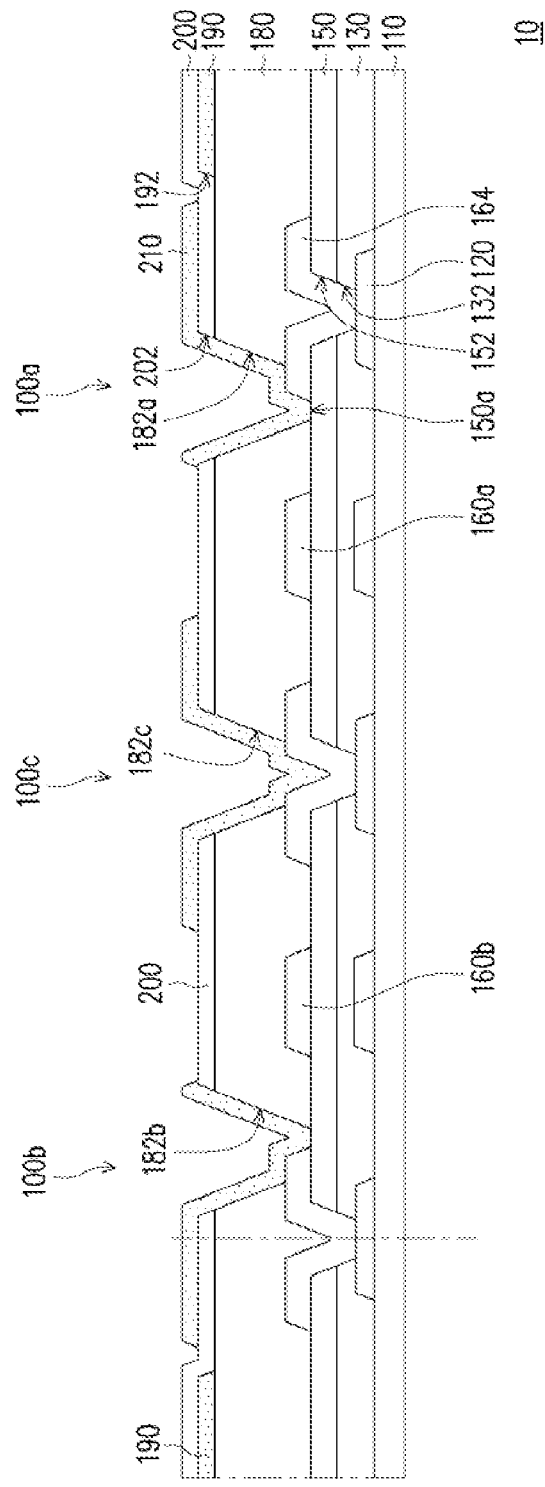
FIG. 5B is a cross-sectional schematic diagram along line A-A' shown in FIG. 5A.

Two adjacent pixel units are used as an example for description in the foregoing embodiments, but the present disclosure is not limited thereto. FIG. 5A is a schematic diagram of a pixel structure according to an embodiment of the present disclosure, and FIG. 5B is a cross-sectional schematic diagram along line A-A' shown in FIG. 5A. Please refer to FIG. 5A and FIG. 5B at the same time. In the present embodiment, the pixel structure 10 may further comprise a third pixel unit 100c, located between the first and second pixel units 100a and 100b. Components of the third pixel unit 100c are similar to those of the first and second pixel units 100a and 100b, described above. In the present embodiment, the pixel units 100a, 100b, and 100c are, for example, a red pixel unit, a blue pixel unit, and a green pixel unit. In the present embodiment, the common opening 192 exposes the contact holes 182a, 182b, and 182c of the adjacent pixel units 100a, 100b, and 100c at the same time. In other words, in the present embodiment, the three adjacent pixel units 100a, 100b, and 100c share the common opening 192 of a common electrode 190. In the present embodiment, the whole contact hole 182c corresponding to the third pixel unit 100c may, for example, expose or uncover a part of a drain 164, and edges of the contact hole 182c are located, for example, within edges of the drain 164. In the present embodiment, an edge of a contact hole 152 corresponding to the third pixel unit 100c is located, for example, within an edge of the contact hole 182c. In the present embodiment, a data line 160a is located, for example, between the first pixel unit 100a and the third pixel unit 100c; and a data line 160b is located, for example, between the second pixel unit 100b and the third pixel unit 100c. A distance between the contact hole 182c and the data line 160a is, for example, substantially the same as a distance between the contact hole 182c and the data line 160b in the vertical projection onto the substrate 110. The contact hole 182a is, relative to the drain 164 of the first pixel unit 100a, close to the data line 160a, and the contact hole 182b is, relative to the drain 164 of the second pixel unit 100b, close to the data line 160b, that is, the symmetry center of the contact hole 182a is closer to the data line 160a than the symmetry center of the drain 164 of the first pixel unit 100a is, and the symmetry center of the contact hole 182b is closer to the data line 160b than the symmetry center of the drain 164 of the second pixel unit 100b is. The present embodiment uses the contact holes 182a and 182b having the same disposition manner as the one in FIG. 4A and FIG. 4B as an example, but the present disclosure is not limited thereto. In other embodiments, the contact holes 182a and 182b may have a disposition manner that is the same as or similar to the disposition manner in FIG. 1A and FIG. 1B, or FIG. 2A and FIG. 2B, or FIG. 3A and FIG. 3B, or FIG. 4A and FIG. 4B, or a combination thereof. It should be particularly noted that, the foregoing embodiment uses the contact holes 182a and 182b shifted towards the data lines 160, 160a, and 160b as an example, but the present disclosure is not limited thereto; that is, the contact holes 182*a* and 182*b* may also deviate together towards another signal line (such as the scan line 140) between the two adjacent pixel units.

Figure 6A:
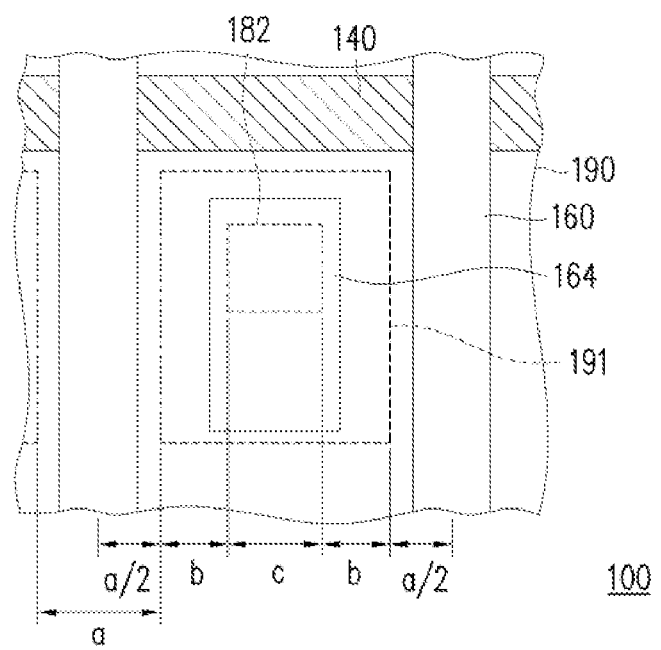
FIG. 6A is a partial schematic diagram of a pixel structure in the related art.

In the foregoing embodiment, because the adjacent pixel units use the same common opening of the common electrode, the width of the pixel unit can be further reduced. More specifically, please refer to FIG. 6A, a conventional pixel structure; an opening 191 of a common electrode 190 of the pixel structure corresponds to one pixel unit 100. Generally speaking, to prevent the common electrode 190 from falling into a contact hole 182 as to avoid short-circuiting a drain 164 and the common electrode 190, a gap meeting the design specifications of 2~2.5 μm is provided between the common electrode 190 and the contact hole 182; and a limitation on the contact hole 182 in the manufacturing process is 4 μm. Therefore, in an extension direction of a signal line (using the scan line 140 as an example, but is not limited thereto), assuming that a width a of the common electrode between two adjacent openings 191 is 2 μm, a distance b between an edge of the contact hole 182 and an edge of the opening 191 is 2 μm, and a size c of the contact hole 182 is 4 μm, the width of one pixel unit is therefore (a+2b+c), i.e., about 10 μm.

Figure 6B:
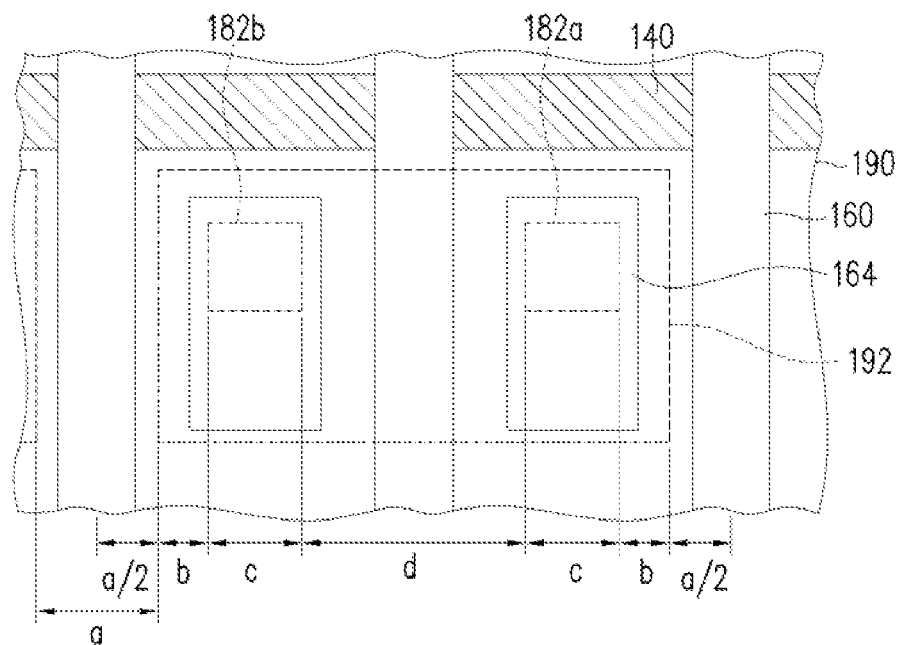
FIG. 6B to FIG. 6D are respective enlarged partial schematic diagrams of FIG. 1A, FIG. 4A, and FIG. 5A.
Figure 6C:
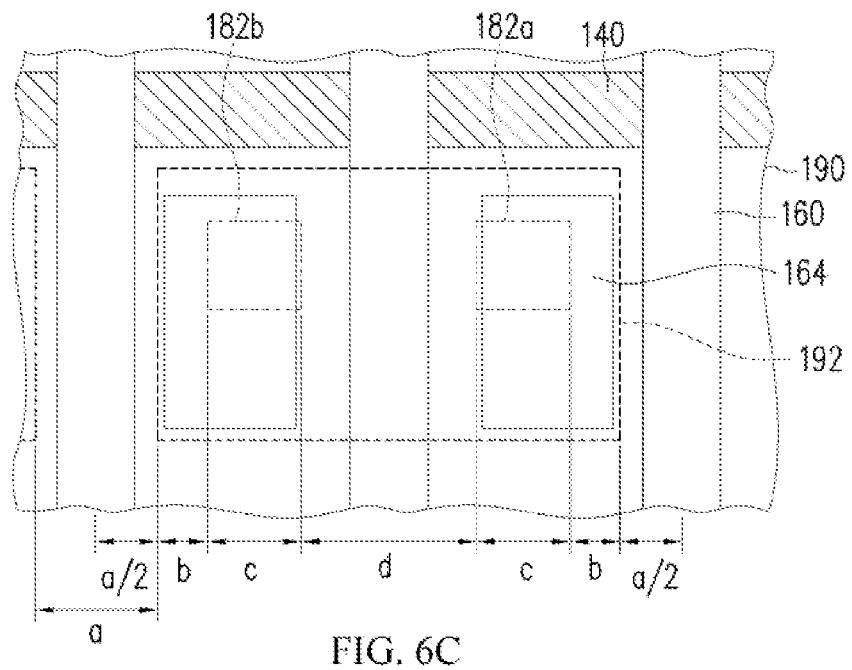
Figure 6D:
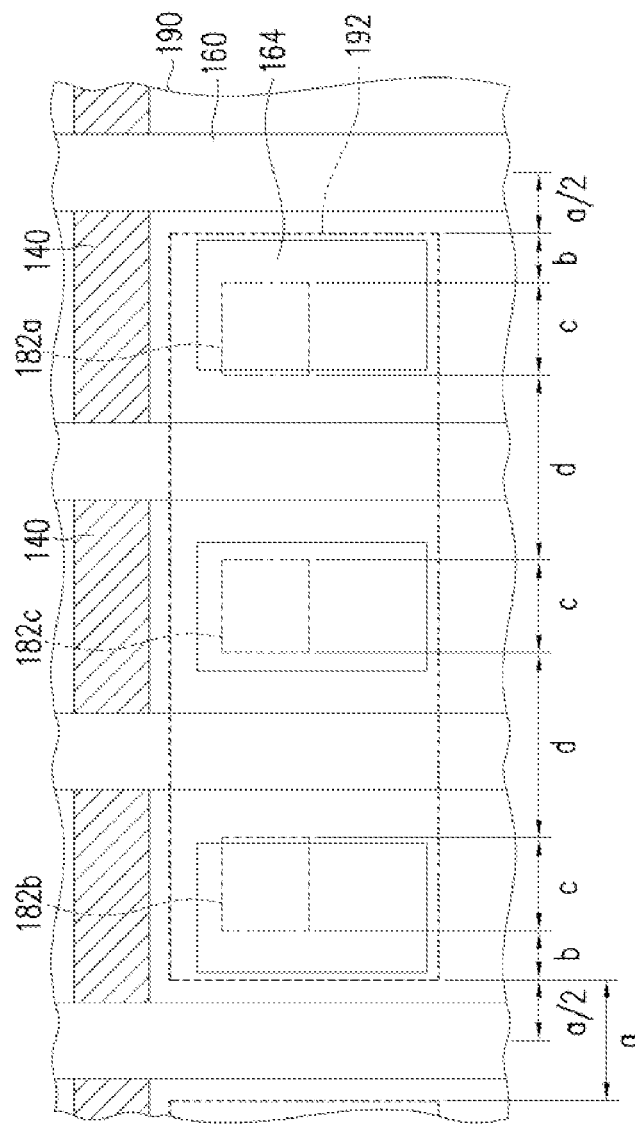

However, in the foregoing embodiment, as shown in FIG. 6B, it is assumed that a width a of the common electrode 190 between two adjacent common openings 192 is 2 μm, a distance b between the edge of the contact hole 182*a* (182*b*) and the edge of the common opening 192 is 2 μm, a size c of the contact holes 182*a* and 182*b* is 4 μm, and a distance d between the two adjacent contact holes 182*a* and 182*b* is 3 μm; in this case, the width of one pixel unit is (½a+b+c+½d), i.e., about 8.5 μm. In another embodiment, as shown in FIG. 6C, a width a of the common electrode 190 between two adjacent common openings 192 is 1.5 to 2 μm, a distance b between the edge of the contact hole 182*a*(182*b*) and the edge of the common opening 192 is 2 to 2.5 μm, a size c of the contact holes 182*a* and 182*b* is 3 to 4 μm, and a distance d between the two adjacent contact holes 182*a* and 182*b* is 1.5 to 2 μm; in this case, the width of one pixel unit is (½a+b+c+½d), i.e., about 6.5 to 8.5 μm. In a further embodiment, as shown in FIG. 6D, a width a of the common electrode 190 between two adjacent common openings 192 is 1.5 to 2 μm, a distance b between the edge of the contact hole 182*a*(182*b*) and the edge of the common opening 192 is 2 to 2.5 μm, a size c of the contact holes 182*a*, 182*b* and 182*c* is 3 to 4 μm, and a distance d between two of the contact holes 182*a*, 182*b* and 182*c* is 4 μm; in this case, the width of one pixel unit is ⅓(a+2b+3c+2d), i.e., about 7.5 to 9 μm. It can be learned from above that the width of the pixel unit in the present embodiment can be further reduced compared with the conventional pixel structure; therefore, the pixel unit in the present embodiment is applicable to a pixel structure required for high resolution.

In conclusion, the insulating layer of the pixel structure in the present disclosure has respective contact holes that uncover drains of pixel units, and the common opening of the common electrode uncovers contact holes of two adjacent pixel units at the same time. In this way, a sufficient gap is maintained between the common opening and the contact hole, so as to avoid short-circuiting the common electrode and the drain. In addition, in an embodiment, adjacent pixel units are made to share one common opening, such that the contact hole of the insulating layer may has a shift distance relative to a signal line between the adjacent pixel units, so as to ensure that a relatively large gap exists between the edge of the contact hole and the common electrode, thus further avoiding short-circuiting the common electrode and the drain. The pixel structure will therefore be equipped with good device properties.

Even though the present disclosure has been disclosed with the above-mentioned embodiments, it is not limited thereto. Any person of ordinary skill in the art may make some changes and adjustments without departing from the spirit and scope of the present disclosure. Therefore, the scope of the present disclosure is defined in view of the appended claims.

What is claimed is:
1. A pixel structure, comprising:
 a first pixel unit, disposed on a substrate, and comprising a first drain, a first source, a first channel layer and a first pixel electrode, wherein the first source is electrically connected to the first channel layer through a specific contact hole;
 a second pixel unit, disposed on the substrate, and comprising a second drain and a second pixel electrode;
 a first insulating layer, covering the first drain and the second drain, wherein the first pixel electrode and the second pixel electrode are disposed on the first insulating layer, and the first insulating layer has a first contact hole uncovering a part of the first drain and a second contact hole uncovering a part of the second drain; and
 a common electrode, disposed on the first insulating layer and electrically insulated from the first pixel electrode and the second pixel electrode, wherein the common electrode has a common opening, and in a vertical projection onto the substrate, both the first contact hole and the second contact hole are located in a region of the common opening.

2. The pixel structure according to claim 1, wherein in the vertical projection onto the substrate, an edge of the first contact hole is located within an edge of the first drain.

3. The pixel structure according to claim 2, further comprising a second insulating layer and a first signal line, wherein the first drain and the second drain are disposed on the second insulating layer and are filled into a third contact hole and a fourth contact hole of the second insulating layer, and the first signal line is located between the first pixel unit and the second pixel unit.

4. The pixel structure according to claim 1, wherein in a horizontal direction, a symmetry center of the first contact hole has a shift distance relative to a symmetry center of the first drain, and an edge of the first contact hole is located within an edge of the first drain.

5. The pixel structure according to claim 4, further comprising a first signal line, located between the first pixel unit and the second pixel unit, wherein the symmetry center of the first contact hole is closer to the first signal line than the symmetry center of the first drain, and a symmetry center of the second contact hole is closer to the first signal line than a symmetry center of the second drain.

6. The pixel structure according to claim 1, further comprising a second insulating layer, wherein the first drain and the second drain are disposed on the second insulating layer, and the first contact hole and the second contact hole uncovers a partial top portion of the second insulating layer, respectively.

7. The pixel structure according to claim 6, further comprising a first signal line located between the first pixel unit and the second pixel unit, wherein a symmetry center of the first contact hole is closer to the first signal line than a symmetry center of the first drain, and a symmetry center of the second contact hole is closer to the first signal line than a symmetry center of the second drain.

8. The pixel structure according to claim 1, further comprising a third insulating layer disposed on the first insulating layer, covering the common electrode, and having a fifth contact hole and a sixth contact hole, wherein the fifth contact hole is in communication with the first contact hole, and the sixth contact hole is in communication with the second contact hole.

9. The pixel structure according to claim 8, wherein the first pixel electrode is disposed on the third insulating layer and is electrically connected to the first drain through the fifth contact hole and the first contact hole, and the second pixel electrode is disposed on the third insulating layer and is electrically connected to the second drain through the sixth contact hole and the second contact hole.

10. The pixel structure according to claim 1, further comprising a third pixel unit having a third drain and a third pixel electrode, wherein the third pixel unit is disposed between the first pixel unit and the second pixel unit.

11. The pixel structure according to claim 10, wherein the first insulating layer further covers the third drain, the third pixel electrode is disposed on the first insulating layer, the first insulating layer further has an eighth contact hole uncovering the third drain, and in the vertical projection onto the substrate, the first contact hole, the second contact hole, and the eighth contact hole all are located in the region of the common opening.

12. The pixel structure according to claim 11, wherein in the vertical projection onto the substrate, the first contact hole and the first drain at least partially overlap, the second contact hole and the second drain at least partially overlap, and an edge of the eighth contact hole is located within an edge of the third drain.

13. The pixel structure according to claim 12, further comprising a first signal line and a second signal line, the first signal line is located between the first pixel unit and the third pixel unit, the second signal line is located between the second pixel unit and the third pixel unit, wherein in the vertical projection onto the substrate, distances from the eighth contact hole to the first signal line and to the second signal line are substantially the same, a symmetry center of the first contact hole is closer to the first signal line than a symmetry center of the first drain, and a symmetry center of the second contact hole is closer to the second signal line than a symmetry center of the second drain.

14. The pixel structure according to claim 12, further comprising a third insulating layer disposed on the first insulating layer, covering the common electrode, and having a fifth contact hole, a sixth contact hole, and a ninth contact hole, wherein the fifth contact hole is in communication with the first contact hole, the sixth contact hole is in communication with the second contact hole, and the ninth contact hole is in communication with the eighth contact hole.

15. The pixel structure according to claim 14, wherein the first pixel electrode is disposed on the third insulating layer and is electrically connected to the first drain through the fifth contact hole and the first contact hole, the second pixel electrode is disposed on the third insulating layer and is electrically connected to the second drain through the sixth contact hole and the second contact hole, and the third pixel electrode is disposed on the third insulating layer and is electrically connected to the third drain through the ninth contact hole and the eighth contact hole.

* * * * *